(12) United States Patent
Hedayat et al.

(10) Patent No.: US 7,512,870 B2
(45) Date of Patent: Mar. 31, 2009

(54) METHOD AND SYSTEM FOR IMPROVING THE PERFORMANCE OF A TRELLIS-BASED DECODER

(75) Inventors: Ahmadreza Hedayat, Allen, TX (US); Hang Jin, Plano, TX (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 11/691,013

(22) Filed: Mar. 26, 2007

(65) Prior Publication Data

US 2008/0056400 A1 Mar. 6, 2008

Related U.S. Application Data

(60) Provisional application No. 60/841,446, filed on Aug. 30, 2006.

(51) Int. Cl.
*H03M 13/03* (2006.01)

(52) U.S. Cl. ........................ 714/795; 792/793; 792/794; 792/752; 375/262; 375/341

(58) Field of Classification Search ................ 714/752, 714/792–796; 375/262, 341
See application file for complete search history.

(56) References Cited

U.S. PATENT DOCUMENTS

| 5,432,803 | A * | 7/1995 | Liu et al. .................... 714/794 |
| 5,878,098 | A * | 3/1999 | Wang et al. .................. 375/377 |
| 6,418,549 | B1 * | 7/2002 | Ramchandran et al. ..... 714/811 |
| 6,477,208 | B1 * | 11/2002 | Huff .......................... 375/265 |
| 7,197,689 | B2 * | 3/2007 | Hekstra et al. ............. 714/792 |
| 2006/0002689 | A1 * | 1/2006 | Yang et al. .................. 386/124 |
| 2007/0092018 | A1 * | 4/2007 | Fonseka et al. ............. 375/265 |

* cited by examiner

*Primary Examiner*—Esaw T Abraham
(74) *Attorney, Agent, or Firm*—Edell, Shapiro & Finnan, LLC (57) ABSTRACT

Method and system are provided for improving the performance of a trellis-based decoder. States with reduced uncertainty (SRUs) are defined for one or more predetermined fields in an encoded message. Metrics are set for the SRUs such that candidate paths through a trellis-based decoding process are eliminated for those states that are not SRUs.

15 Claims, 9 Drawing Sheets

METHOD AND SYSTEM FOR IMPROVING THE PERFORMANCE OF A TRELLIS-BASED DECODER

CROSS REFERENCE

The present application claims the benefit of U.S. Provisional Application Ser. 60/841,446, which was filed on Aug. 30, 2006.

BACKGROUND

Trellis codes, such as convolutional codes, trellis coded modulation, bit-interleaved coded modulations, and space-time trellis codes have been widely used to improve the performance of a wireless communications system. One important issue of encoding messages using trellis codes is how to terminate a trellis. There are at least two common methods of terminating a trellis.

The first method is to force the encoder of a transmitting wireless station to enter a known starting state and then to a known terminating state, e.g. a zero state, after the last data bit is shifted in. This is commonly referred to as a zero-padding (ZP) method. This method brings the trellis into a known terminating state by feeding the encoder with a series of zeros after all data bits are shifted into the encoder. The number of zeros is equal to the size of the memory. Feeding the encoder with a series of zeros resets the state back to zero.

The trellis code decoder of a receiving wireless station decodes a receiving message using the information about the starting and terminating states of the trellis. Knowing the starting and terminating states of a trellis simplifies the design of the decoder of a receiving wireless station. However, the padding of zeros at the end of trellis codes results in additional overhead. This problem is especially significant when the message is of small size.

Another method to terminate a trellis is called tail-biting (TB). In TB, the encoder of a transmitting wireless station is forced to terminate the encoding of a message at a state that is the same as the starting state. Since the TB method does not pad a trellis-encoded message with extra zeros, it does not result in extra overhead. Because the TB method starts and terminates a trellis in the same state, which is unknown to the decoder, decoding the tail-biting trellis with a trellis-based decoder is computationally expensive.

A trellis-based decoder employing the Viterbi algorithm (VA) is a maximum likelihood (ML) decoder if the starting and terminating states of the message encoded with trellis codes are known.

Because the starting and terminating states in a tail-biting method are the same, the ML decoder runs the Viterbi algorithm in each state and selects the code sequence representing the message with the highest probability. The brute force decoding method runs the Viterbi algorithm as many times as the number of states is; therefore, it demands a lot of computational resources. To reduce the computational complexity of the ML decoder for tail-biting trellis codes, several suboptimal trellis-based decoders have been developed.

As such, what is desired is a method and system for further improving the performance of sub-optimal trellis-based tail-biting decoders

SUMMARY

A method and system are provided for improving the performance of a trellis-based decoder. States with reduced uncertainty (SRUs) are defined for one or more predetermined fields in an encoded message. Metrics are set for the SRUs such that candidate paths through a trellis-based decoding process are eliminated for those states that are not SRUs.

The construction and method of operation of the method and system together with additional objects and advantages thereof, will be best understood from the following description of specific embodiments when read in connection with the accompanying drawings.

DESCRIPTION

A method and system are provided for improving the performance of suboptimal trellis-based decoders employing the Viterbi algorithm by incorporating the information about the structure of the messages in the decoding process. The techniques described herein are applicable to all types of trellis-based decoders for tail-biting trellis code.

The techniques described herein take advantage of the knowledge about a predetermined field in a message. The information is used either to improve the performance of a decoder or to reduce the complexity of the decoder. The decoder is programmable, i.e., the decoder can decode messages with different types of predetermined fields of various lengths and at various locations.

The method disclosed herein exploits the information about the structure of a message to improve the performance of a trellis-based decoder. One such structure is the control message of communication standards, such as IEEE 802.16 (WiMax), which usually includes predetermined fields of known sizes. The bits in a predetermined field are usually set to a predetermined value (e.g. zero).

Figure 1A:
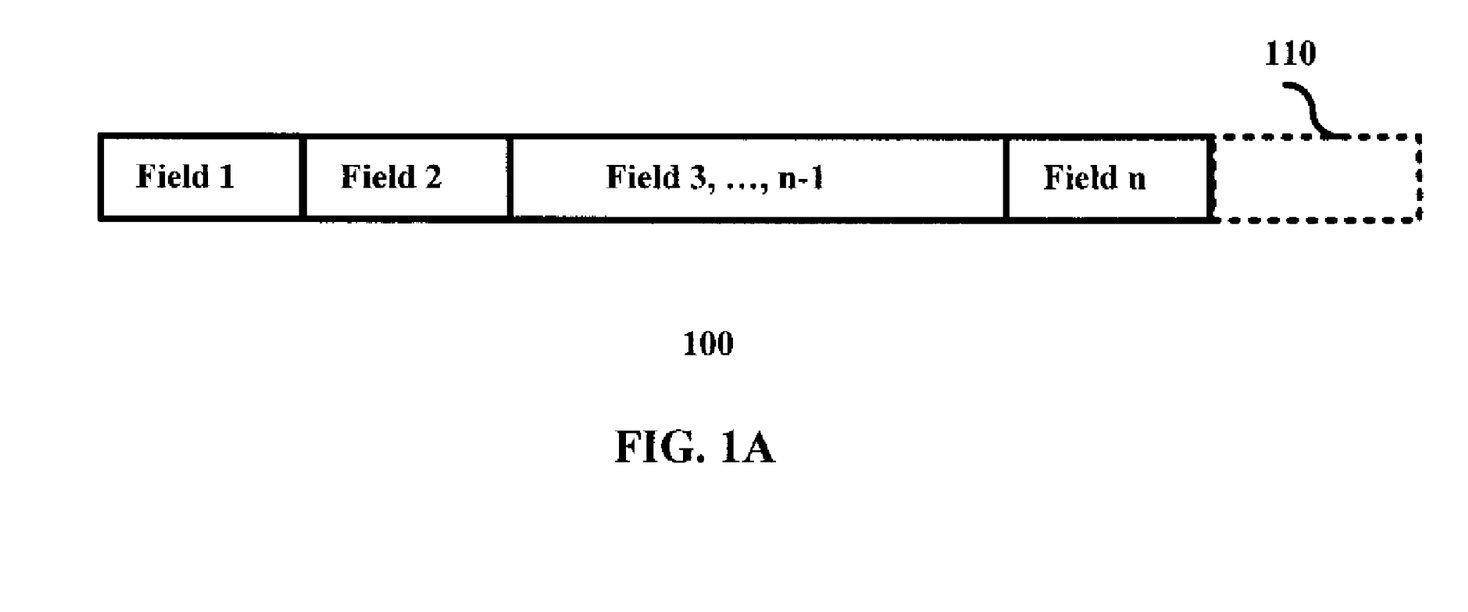
FIGS. 1A, 1B, and 1C illustrate a message with one predetermined field.
Figure 1B:
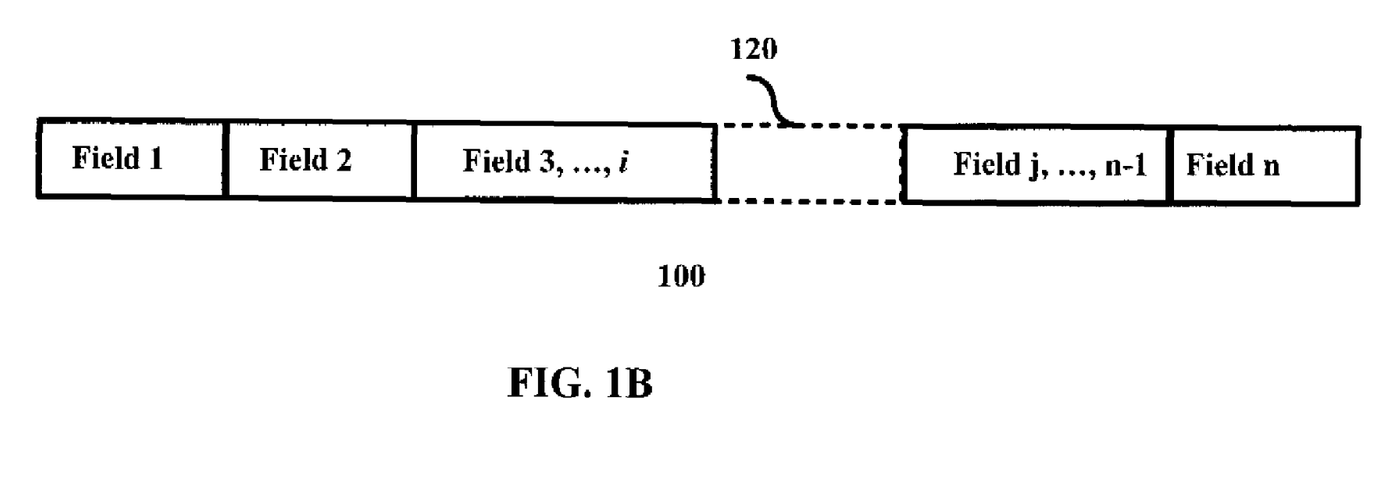
Figure 1C:
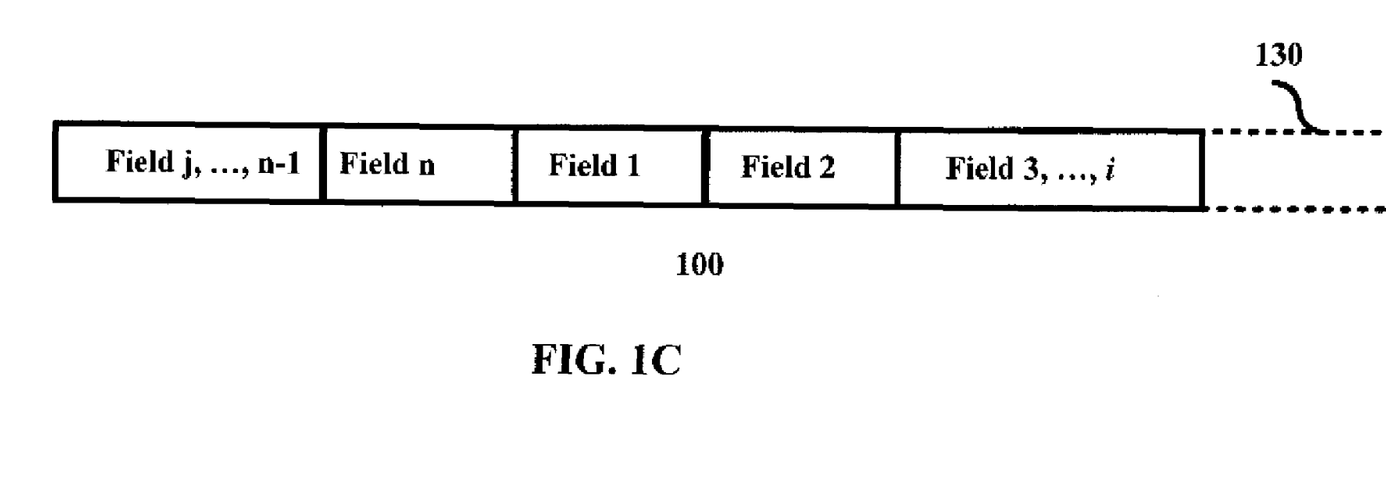

FIGS. 1A, 1B, and 1C illustrate a message with just one predetermined field. In FIG. 1A, a predetermined field 110 is located at the end of a message while in FIG. 1B a predetermined field 120 is in the middle of a message. At first glance, the messages in FIG. 1A and FIG. 1B seem to have different structures. However, if the fields in the message in FIG. 1B are rotated till the predetermined field 130 is at the end of the message, as shown in FIG. 1C, a person having skills in the art would recognize that the two messages have the same structure.

Figure 2:
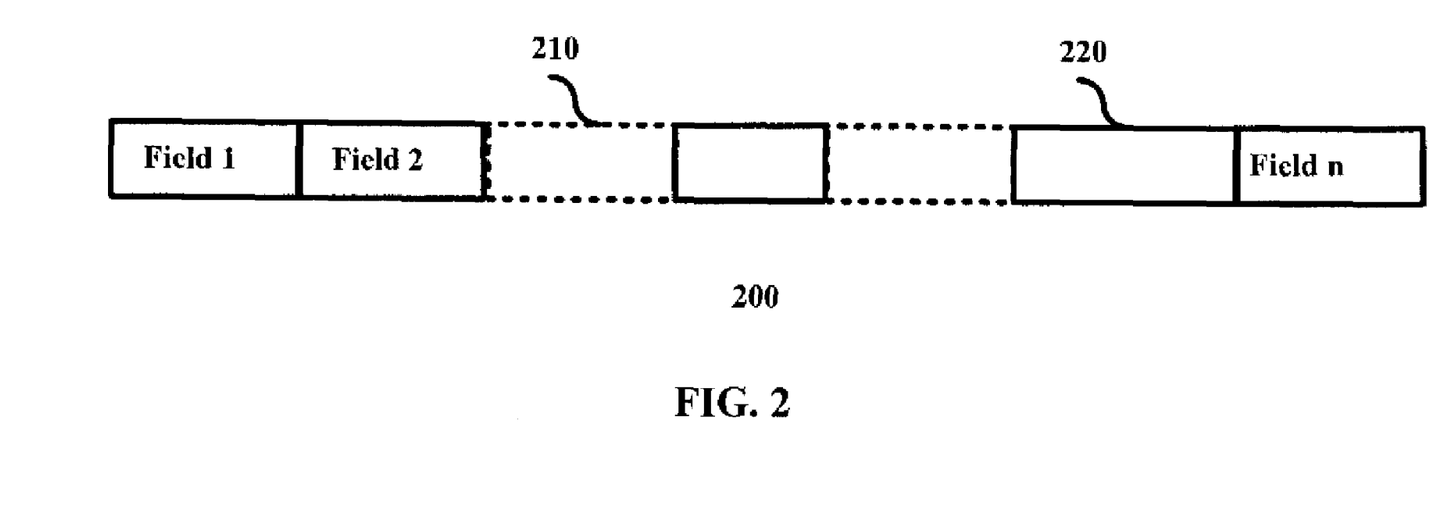
FIG. 2 illustrates a message with multiple predetermined fields.
Figure 3:
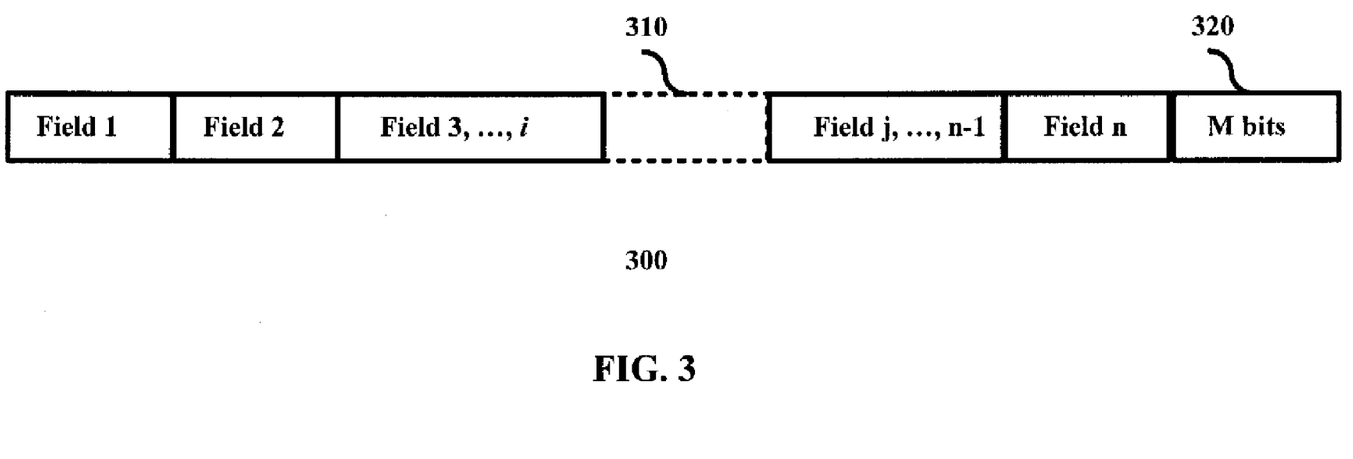
FIG. 3 illustrates a message with a predetermined field and appended with additional bits of a predetermined value at the end of the message.

A control message may have multiple predetermined fields at several locations in a message. FIG. 2 illustrates a message with multiple predetermined fields 210 and 220. FIG. 3 illustrates a message having a predetermined field 310 and appended additional bits 320 of a predetermined value at the end of the message.

In a WiMax wireless communications system, the FCH is convolutionally encoded using tail-biting termination. The encoder has six memory cells, which means that there are 64 possible states. In other words, the starting or terminating state has a probability of 1/64 being in any of the 64 states.

By knowing that there is a 4-bit predetermined field in the frame control header (FCH), the disclosed method reduces the number of possible states of a trellis-based decoder. Assuming that the reserved bits in the predetermined field are all set to zero, the number of states is reduced to 4. By setting the four reserved bits to zero, the numbers representing the starting and terminating states are multiples of 16. In other words, the starting and terminating states are one or two of the following states—{0,16,32,48}.

The term "the state with reduced uncertainty" (SRU) refers to a set of states that are associated with a predetermined field. The maximum likelihood path passes through one of these states by the end of the predetermined field.

Each SRU is associated with a time instance determined by the location of the predetermined state. The values of the states in an SRU are determined by the values of the bits in predetermined fields. Effectively, the information about each predetermined field reduces the number of states that the maximum likelihood path might pass through at the end of the predetermined field. As a result the probability that the maximum likelihood path passes through one of the states in the SRU increases and thus the uncertainty is reduced.

The actual value of a predetermined bit is inconsequential as long as it is known a prior by the decoder. The non-zero predetermined bits change the SRU, but its size remains intact. The performance improvement or complexity reduction only depends on the size of the SRU.

A decoder can use the SRU in various ways. For example, a trellis-based decoder for tail-biting (TB) trellis codes performs the VA algorithm only in the states of the SRU rather than all possible states. In the example described above, the VA algorithm only needs to repeat four times rather than 64 times.

The level of reduction in the complexity of a decoder depends on the number of bits in a predetermined field in a message and the number of memory cells (equivalent to the number of states) of the trellis code. As a result, the trellis-based decoder for TB trellis codes does not guarantee that it always reduces the complexity to the same degree. However, it is possible to take advantage of the SRU in sub-optimal trellis-based decoders for TB trellis codes.

A trellis-based decoder for convolutional codes is modeled and evaluated based on the level of its complexity and performance. The information about the SRU can be used to either reduce the complexity or improve the performance of a decoder. It is feasible to devise a decoder with a tradeoff between the performance and complexity.

A sub-optimal trellis-based decoder for TB trellis codes improves its performance by using the SRU to reduce the uncertainty in the initialization process. Depending on the number of states of trellis codes and the length of a message, most sub-optimal trellis-based decoders for TB trellis codes perform the VA algorithm more than once over the whole length of the message or part of the message in order to achieve a level of performance close to that of an optimal trellis-based decoder for TB trellis codes. For a short message that has a trellis code with a large number of states, the VA algorithm may be performed over the whole message twice or three times.

After a trellis-based decoder initializes the states based on the information about the SRU, its complexity is reduced. The decoder achieves similar performance as an optimal trellis-based decoder for TB trellis codes does, but it performs the VA algorithm with fewer iterations.

For the SRU of small size, the trellis-based decoder could run the VA algorithm once and then traces back (i.e. terminates the decoder) from the state that has the best metric at the end of the trellis. In this case, the complexity of the decoder is reduced by some degree and the level of performance is also improved to some degree.

Figure 4:
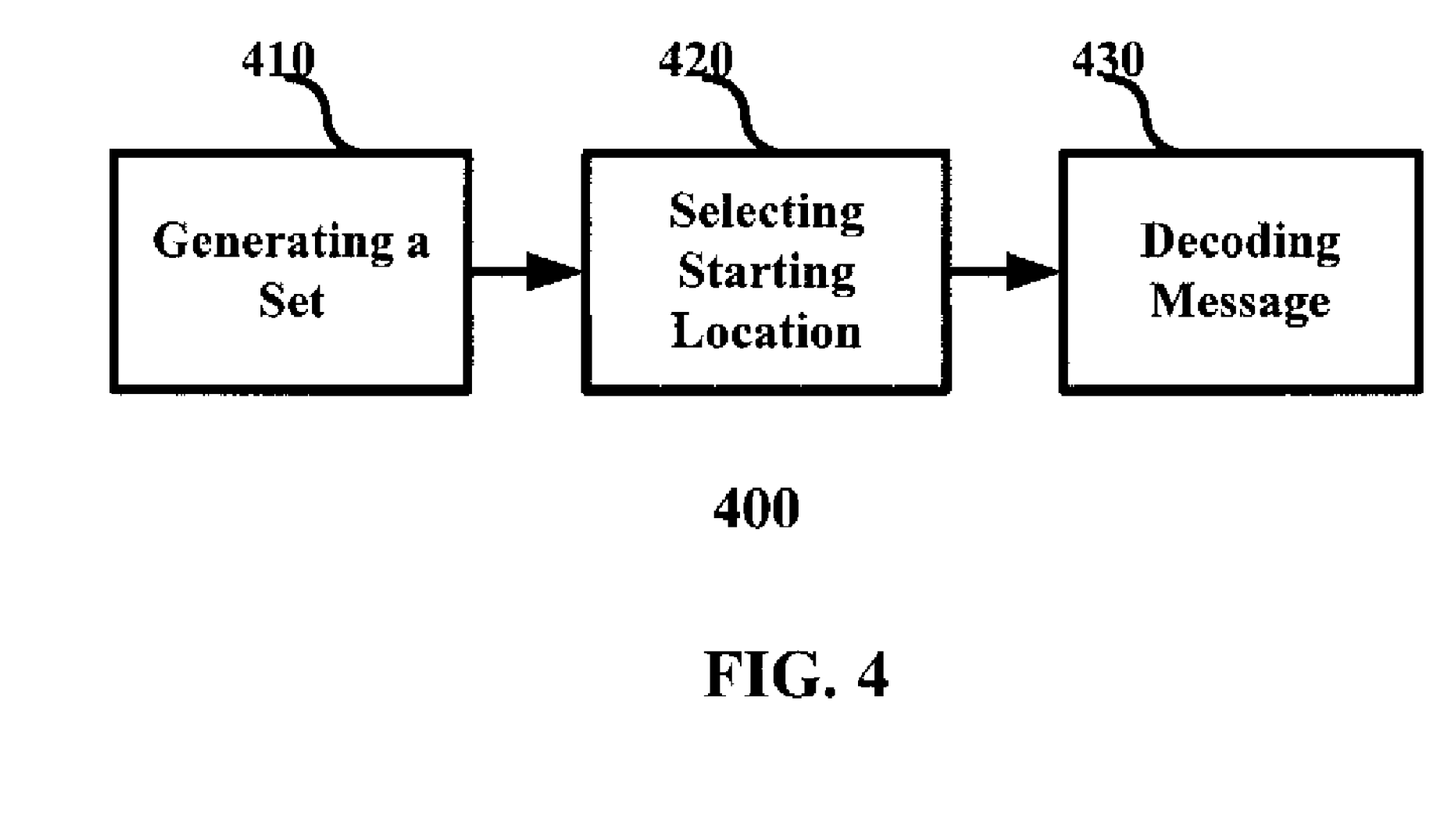
FIG. 4 is a flow diagram that depicts a way to improve the performance of a Viterbi decoder by using the information about one predetermined field of a message.

FIG. 4 is a flow diagram that depicts a way to improve the performance of a trellis-based decoder by using the information about one predetermined field of a message in accordance with the method disclosed herein.

The message structure is described in FIG. 1A and FIG. 1B. In step 410, the metric of a state in a trellis-based decoder is set depending on whether it is in the SRU. The states in the SRU are assigned with the same metric, i.e. zero. This is equivalent to making the probabilities of all the states in the SRU equal. Let the probabilities of the other states be set to the minimum or the largest negative number in logarithmic metric calculations.

In step 420, the location (time instance) of an encoded message sequence is selected. Because the message is terminated using a tail-biting method, the trellis representing the message is circular. In other words, the decoding algorithm such as the VA continues onto the beginning of the message after the end of the message is approached. Because of this property, the decoding process can start at any location in the encoded message sequence. This explains why FIG. 1A and FIG. 1B are deemed equivalent from a TB decoding perspective (see FIG. 1C).

In step 430, the decoding process starts from the selected location. The decoding process continues until the message is decoded and the terminating state of the decoder coincides with the starting state. Taking advantage of the SRU, the decoding process can start from the field next to the right of the predetermined field.

Figure 5:
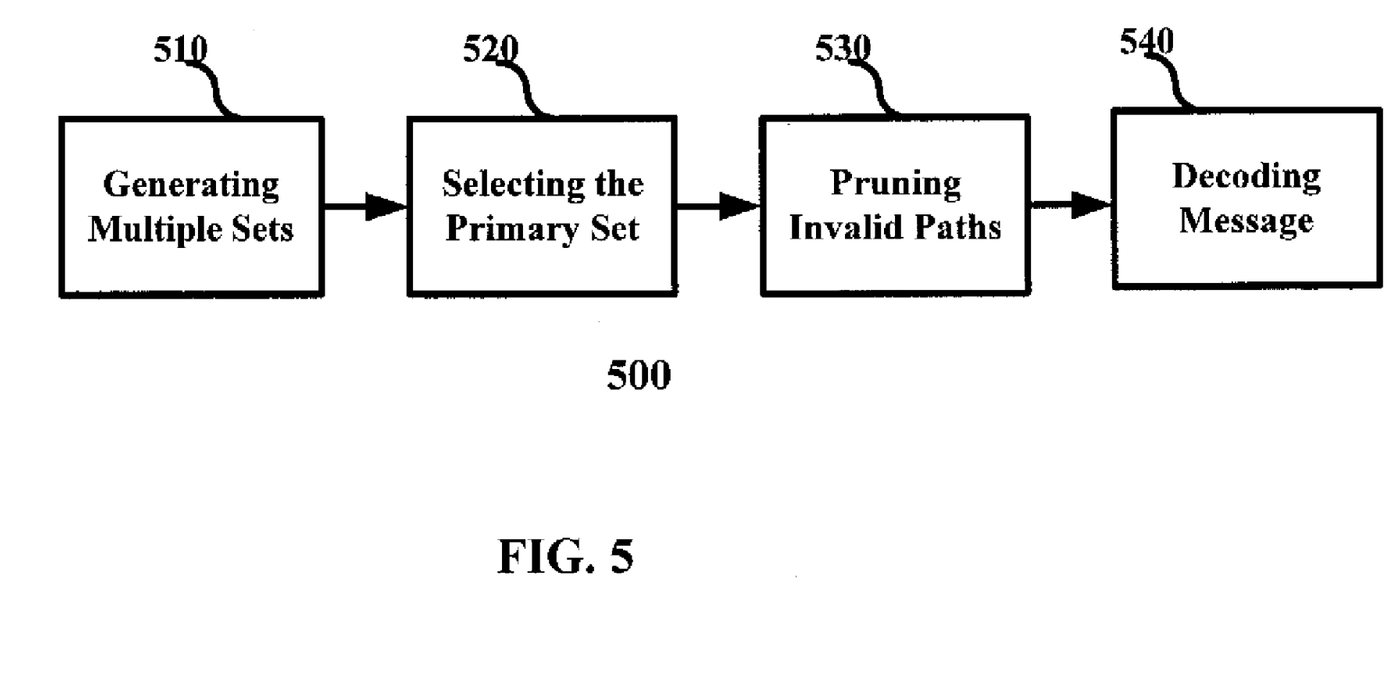
FIG. 5 is a flow diagram that depicts a way to improve the performance of a Viterbi decoder by using the information about multiple predetermined fields of a message.

FIG. 5 is a flow diagram that depicts a way to improve the performance of a trellis-based decoder by using the information about multiple predetermined fields of a message in accordance with the techniques described herein. The message structure is described in FIG. 2.

In step 510, multiple SRUs are generated. Each of the SRUs corresponds to one predetermined field. In step 520, one of the SRUs is selected as the primary SRU. Because the location and the size of each of the multiple predetermined fields are known to the trellis-based decoder, the trellis-based decoder can use this additional information to further improve the performance of the decoding process. One way to utilize the information about the structure of the message is to select a SRU with the smallest size.

Assume that there are two predetermined fields with predetermined bits $K_1$ and $K_2$, and $K_2 > K_1$. Let $SRU_1$ represent a reduced set of states corresponding to the first predetermined field. Let $SRU_2$ represent a reduced set of states corresponding to the second predetermined field. Because $SRU_2$ is the smaller of the two, tail-biting decoding is performed based on $SRU_2$.

The metric of a state in the trellis-based decoder is set depending on whether it is in $SRU_2$. Each of the states in $SRU_2$ is assigned the same metric, i.e., zero. This is equivalent to making the probabilities of all the states in $SRU_2$ equal. Let the probabilities of the other states be set to the minimum or the largest negative number in logarithmic metric calculations.

Step 530 shows that at a predetermined time instance, the trellis-based decoder sets the metrics of the states that do not belong to $SRU_1$ in such a way that the probabilities of these states are the minimum. This is equivalent to setting such states to the smallest number, or the largest negative number in logarithmic metric calculations. This action effectively prunes the trellis to eliminate the invalid candidate paths. This is because the maximum likelihood path must pass through one of the states that belong to $SRU_1$ at the predetermined time instance.

In step 540, the decoding process continues until the message is decoded and the terminating state of the decoder coincides with the starting state.

Figure 6:
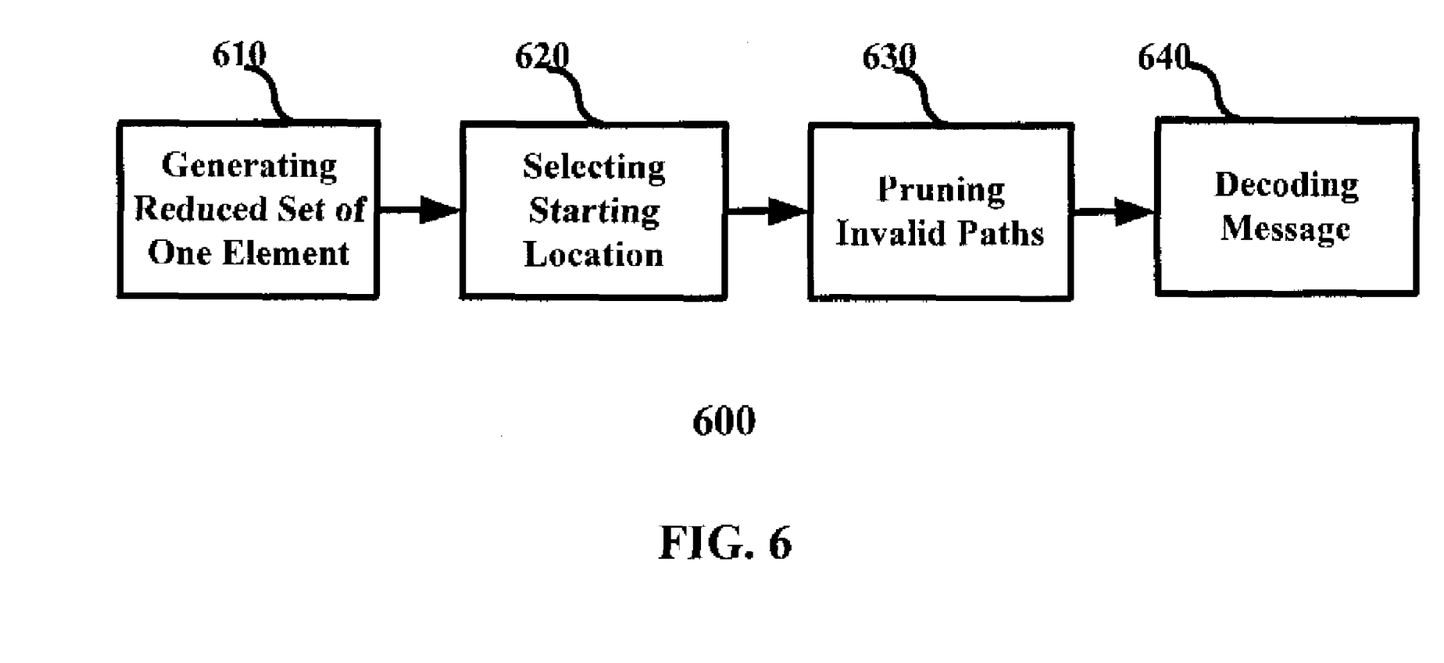
FIG. 6 is a flow diagram that depicts a way to improve the performance of a Viterbi decoder by using the information about one predetermined field of a message which is convolutionally encoded using a zero-padding method.

FIG. 6 is a flow diagram that depicts a way to improve the performance of a trellis-based decoder by using the information about one predetermined field of a message, which is convolutionally encoded using a zero-padding in accordance with the method disclosed herein. The message is appended with bits of a predetermined value at the end of the message. The message structure is described in FIG. 3.

In step 610, a zero-padding method is applied to the message by inserting M zero bits at the end of the message. The size of the memory cells of the trellis code is M. In essence, the M zero tail bits create an SRU with a size of one, and the only element in the SRU is the all-zero state.

In step 620, the trellis-based decoder employs a conventional VA algorithm to decode the encoded message. In step 630, the trellis-based decoder sets the metric of a state to the smallest number or the largest negative number in logarithmic metric calculations, depending on whether it is in the SRU at a predetermined time instance. This action effectively prunes the trellis to eliminate the invalid paths. As a result the performance of the trellis-based decoder is further improved.

In step 640, the decoding process continues until the message is decoded and the termination state of the trellis-based decoder coincides with the starting state.

Figure 7:
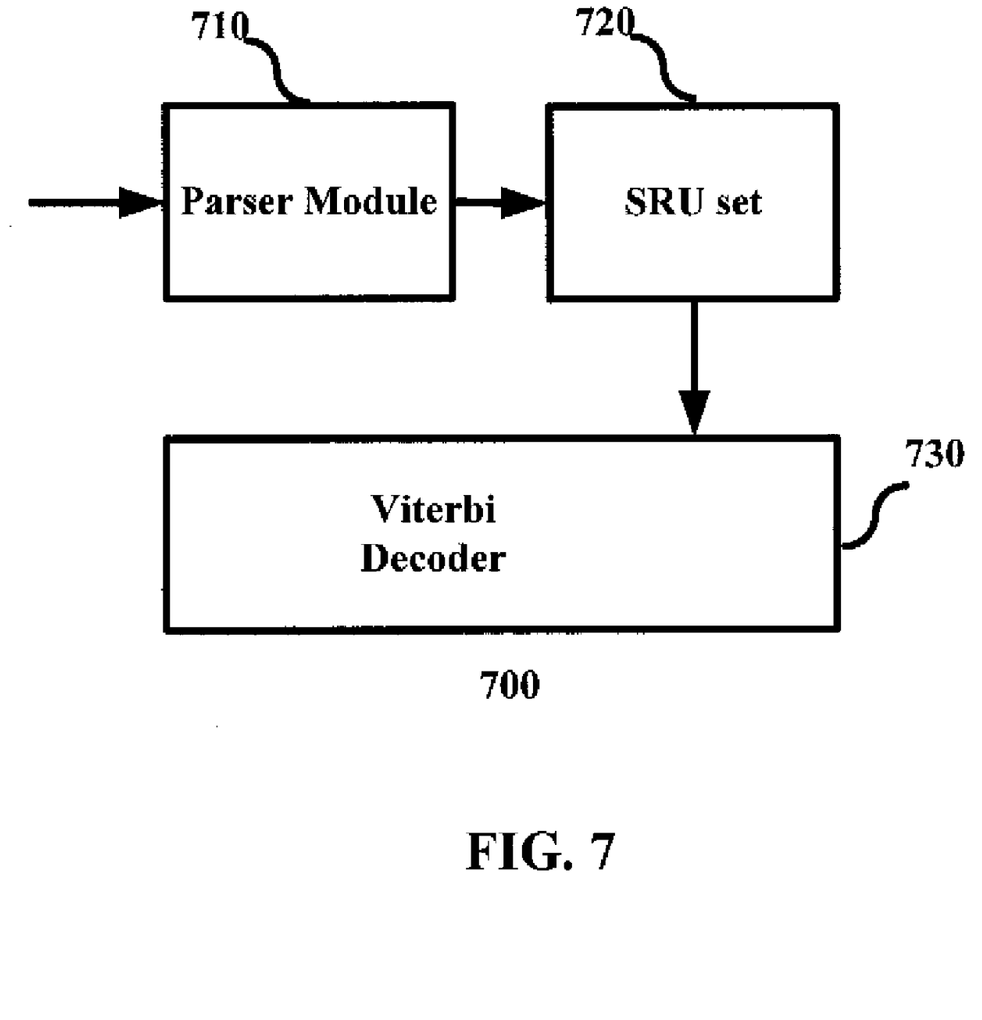
FIG. 7 is a block diagram of a system in accordance with the techniques described herein.

FIG. 7 is a block diagram of a system in accordance with the present invention. The system is composed of a parser module 710, an SRU module 720, and a trellis-based decoder 730.

The parser module 710 identifies one or more predetermined fields in a message with a known value using the knowledge of the structure of the message. The means 720 generates one or more sets of states with reduced uncertainty (SRUs) based on the values of one or more predetermined fields.

The trellis-based decoder 730 initializes the states based on the information about the SRU of the smallest size and sets the metrics of the states in the SRU in such a way that the probabilities of the states are equal. The trellis-based decoder 730 selects a starting state, which could be any state in the encoded message sequence. Because the encoded message is terminated using a tail-biting method, the trellis representing the message is circular. The trellis-based decoder 730 prunes the trellis to eliminate the invalid paths while decoding the message by setting the metrics of the states that are not in the SRU in such a way that the probabilities of the states are the minimum.

The above illustration provides many different embodiments or embodiments for implementing different features described herein. Specific embodiments of components and processes are described to help clarify these features. These are, of course, merely embodiments and are not intended to be limiting.

Although the method and system are illustrated and described herein as embodied in one or more specific examples, it is nevertheless not intended to be limited to the details shown, since various modifications and structural changes may be made therein without departing from the spirit of the concepts described herein and within the scope and range of equivalents of the claims. Accordingly, it is appropriate that the appended claims be construed broadly and in a manner consistent with the scope as set forth in the following claims.

What is claimed is:

1. A method comprising:
   receiving a message at a communication device, wherein the message comprises a plurality of fields including at least one predetermined field whose bit values are known at the communication device;
   generating states with reduced uncertainty for the at least one predetermined field in the message, wherein the states with reduced uncertainty are states for a trellis-based decoding process and are associated with the at least one predetermined field of the message such that a maximum likelihood path of the trellis-based decoding process passes through one of the states of reduced uncertainty by the end of the predetermined field when decoding the message, and wherein values for the states of reduced uncertainty are determined by values of bits in the at least one predetermined field;
   setting a metric for a state of the trellis-based decoding process depending on whether or not the state is one of the states of reduced uncertainty, by:
      setting metrics for those states that are one of the states of reduced uncertainty to a first predetermined value such that each of the states of reduced uncertainty has equal probability; and
      setting metrics for states that are not states with reduced uncertainty to a second predetermined value which corresponds to a minimum probability;
   eliminating invalid candidate paths associated with the trellis-based decoding process for states that are not states with reduced uncertainty; and
   decoding the message for a reduced number of candidate paths based on said eliminating.

2. The method of claim 1, wherein receiving comprises receiving the message comprising a plurality of predetermined fields whose bit values are known at the communication device, and wherein generating comprises generating multiple sets of states with reduced uncertainty each set for a corresponding predetermined field in the message, and selecting one of the multiple sets of states of reduced uncertainty as a primary set, and wherein setting comprises setting a metric for a state depending on whether or not it is part of the primary set of states with reduced uncertainty such that states that are part of the primary set of states with reduced uncertainty are set to the first predetermined value and states that are not part of the primary set of states with reduced uncertainty are set to the second predetermined value.

3. The method of claim 2, wherein selecting comprises selecting a set of states with reduced uncertainty that is associated with one of the plurality of predetermined fields that has a least number of bits as the primary set of states with reduced uncertainty.

4. The method of claim 3, wherein receiving comprises receiving the message with the at least one predetermined field in the message comprising additional bits appended to the message by a zero-padding method.

5. The method of claim 3, wherein eliminating comprises eliminating invalid candidate paths for those states that are not in the primary set of states with reduced uncertainty.

6. The method of claim 1, wherein the first predetermined value is zero.

7. The method of claim 1, wherein the second predetermined value is a largest negative number resulting from logarithmic metric calculations.

8. A method comprising:

receiving a message at a communication device, wherein the message comprises a plurality of fields including a plurality of predetermined fields whose bit values are known at the communication device;

generating multiple sets of states with reduced uncertainty each set for a corresponding predetermined field in the message, wherein the states with reduced uncertainty in a set are states for a trellis-based decoding process such that a maximum likelihood path of the trellis-based decoding process passes through one of the states of reduced uncertainty of a set by the end of the corresponding predetermined field when decoding the message, and wherein values for the states of reduced uncertainty in a set are determined by values of bits in the corresponding predetermined field;

selecting one of the multiple sets of states with reduced uncertainty as a primary set;

setting a metric for a state depending on whether or not it is part of the primary set of states with reduced uncertainty such that states that are part of the primary set of states with reduced uncertainty are set to a first predetermined value and states that are not part of the primary set of states with reduced uncertainty are set to a second predetermined value which corresponds to a minimum probability; and eliminating invalid candidate paths associated with the trellis-based decoding process for states that are not in the primary set of states with reduced uncertainty; and decoding the message for a reduced number of candidate paths based on said eliminating.

9. The method of claim 8, wherein selecting comprises selecting the set of states with reduced uncertainty that is associated with one of the plurality of predetermined fields that has a least number of bits as the primary set of states with reduced uncertainty.

10. The method of claim 9, wherein receiving comprises receiving the message with the plurality of predetermined fields comprising additional bits appended to the message by a zero-padding method.

11. The method of claim 8, wherein the second predetermined value is a largest negative number resulting from logarithmic metric calculations.

12. An apparatus comprising:

a parser module that is configured to identify at least one predetermined field in a received message based on knowledge of a structure of the received message in a received message, wherein the at least one predetermined field has values that are known;

a states with reduced uncertainty module coupled to the parser module that is configured to generate states with reduced uncertainty for the at least one predetermined field in the message, wherein the states with reduced uncertainty are states for a trellis-based decoding process and are associated with the at least one predetermined field of the message such that a maximum likelihood path of the trellis-based decoding process passes through one of the states of reduced uncertainty by the end of the predetermined field when decoding the message, and wherein values for the states of reduced uncertainty are determined by values of bits in the at least one predetermined field, and wherein the states with reduced uncertainty module is further configured to set a metric for a state depending on whether or not the state is one of the states of reduced uncertainty by setting metrics for states that states with reduced uncertainty to a first predetermined value such that each of the states with reduced uncertainty has equal probability and setting metrics for states that are not states with reduced uncertainty to a second predetermined value which corresponds to a minimum probability; and a decoder module coupled to the states with reduced uncertainty module that is configured to eliminate invalid candidate paths in the trellis-based decoding process for states that are not states with reduced uncertainty while decoding the received message.

13. The apparatus of claim 12, wherein the parser module is configured to identify each of a plurality of predetermined fields whose bit values in the received message are known, and wherein the states with reduced uncertainty module is configured to generate multiple sets of states with reduced uncertainty each set for a corresponding predetermined field in the message, and to select one of the multiple states of uncertainty as a primary set, and to set a metric for a state depending on whether or not it is part of the primary set of states with reduced uncertainty such that states that are part of the primary set of states with reduced uncertainty are set to the first predetermined value and states that are not part of the primary set of states with reduced uncertainty are set to the second predetermined value.

14. The apparatus of claim 13, wherein the states with reduced uncertainty module is configured to select a set of states with reduced uncertainty that is associated with one of the plurality of predetermined fields that has a least number of bits as the primary set of states with reduced uncertainty.

15. The apparatus of claim 14, wherein the decoder module is configured to eliminate those states that are not in the primary set of states with reduced uncertainty.

* * * * *